United States Patent [19]

Baba

[11] Patent Number: 5,170,061

[45] Date of Patent: Dec. 8, 1992

[54] METHOD OF AND APPARATUS FOR MEASURING OSCILLATION OF THE OUTSIDE DIAMETER OF A MELT SURFACE

[75] Inventor: Masahiko Baba, Annaka, Japan

[73] Assignee: Shin-Etsu Handotai Company, Limited, Tokyo, Japan

[21] Appl. No.: 693,171

[22] Filed: Apr. 29, 1991

[30] Foreign Application Priority Data

Apr. 29, 1990 [JP] Japan .................. 2-113289

[51] Int. Cl.$^5$ .......................................... G01V 9/04
[52] U.S. Cl. .................................. 250/561; 250/560; 156/601
[58] Field of Search ............... 250/560, 561; 356/384; 156/601, 617.1

[56] References Cited

U.S. PATENT DOCUMENTS

| | | | |
|---|---|---|---|
| 3,740,563 | 6/1973 | Reichard | 250/222 |
| 3,998,598 | 12/1976 | Bonora | 156/601 |
| 4,710,258 | 12/1987 | Latka | 156/601 |
| 4,794,263 | 12/1988 | Katsuoka et al. | 250/560 |
| 4,973,377 | 11/1990 | Katsuoka et al. | 156/601 |

OTHER PUBLICATIONS

Yoshinaru, Abe "Apparatus for Preparing Crystal", *Patent Abstracts of Japan*, vol. 7, No. 248 (C-193) [1393], Nov. 4, 1983.

Asaji, Kawanabe "Pulling Up Device for Single Crystal Semiconductor", *Patent Abstracts of Japan* vol. 7, No. 118 (C-167)[1263], May 21, 1983.

Makine, Hideo "Method for Controlling Diameter of Single Crystal", *Patent Abstracts of Japan* vol. 13, No. 308, Jul. 14, 1989.

*Primary Examiner*—David C. Nelms
*Assistant Examiner*—Que T. Le
*Attorney, Agent, or Firm*—Browdy and Neimark

[57] ABSTRACT

A method and an apparatus for measuring oscillation of a melt surface in growing a single crystal by Czochralski process, particularly in growing and pulling a crystal neck portion having a small diameter of 2 to 5 mm. The image of a region where the single crystal is being grown by the Czochralski process is taken by a camera 38 and the outside diameter $D_o$ of a bright ring image 70 of a brightness not lower than a predetermined reference value E is detected in accordance with video signals produced by the camera (Steps 80-83). The amount of oscillation of the outside diameter $D_o$ is measured as the amount $S_v$ of oscillation of the melt surface near the region where the single crystal is grown. The reference value E is determined by multiplying the maximum value of the video signals in one field with a predetermined constant K. The constant K is a value which, when the velocity of pulling of the single crystal is fixed to zero, substantially maximizes the amount of $S_v$ of oscillation of the outside diameter $D_o$.

18 Claims, 8 Drawing Sheets

METHOD OF AND APPARATUS FOR MEASURING OSCILLATION OF THE OUTSIDE DIAMETER OF A MELT SURFACE

BACKGROUND OF THE INVENTION

1. Field of the Invention

The present invention relates to a method of and an apparatus for measuring oscillation of the surface of a melt for use in growing a single crystal by Czochralski method.

2. Description of the Related Art

In single crystal growing apparatus which grows a single crystal by Czochralski method, an automatic control method has been established for the control of the growing operation conditions after forming a conical portion. However, manual control by a skilled operator is still necessary in the period for forming a neck portion, until the conical portion is formed after dipping of a seed crystal in the melt. This is because the formation of a neck portion requires highly delicate controls for the purpose of terminating dislocation at the crystal surface, such as growing of the crystal at a comparatively high velocity of 2 mm/min or greater while restricting the diameter of the crystal to 2 to 5 mm, and growing of the neck portion to a length which is 10 or more times greater than the diameter thereof while controlling the diameter at a precision of 0.5 mm or less in terms of the absolute value of the control offset. It is very difficult to obtain a desired form of the crystal without allowing the presence of dislocation in the transient period between the neck forming period and a subsequent increase in the crystal diameter. In fact, it is said that about 10% of such a manual control results in a failure even when it is done by those skilled in the art. More specifically, when the diameter of the crystal is reduced excessively, the lower end of the grown crystal is disconnected from the melt surface to disable further growth of the crystal or the strength of the crystal becomes too small to maintain the straight cylindrical portion of the crystal which is grown subsequently. Conversely, a too large crystal diameter hampers termination of dislocation, making it impossible to start the growth of the conical portion.

Figure 1:
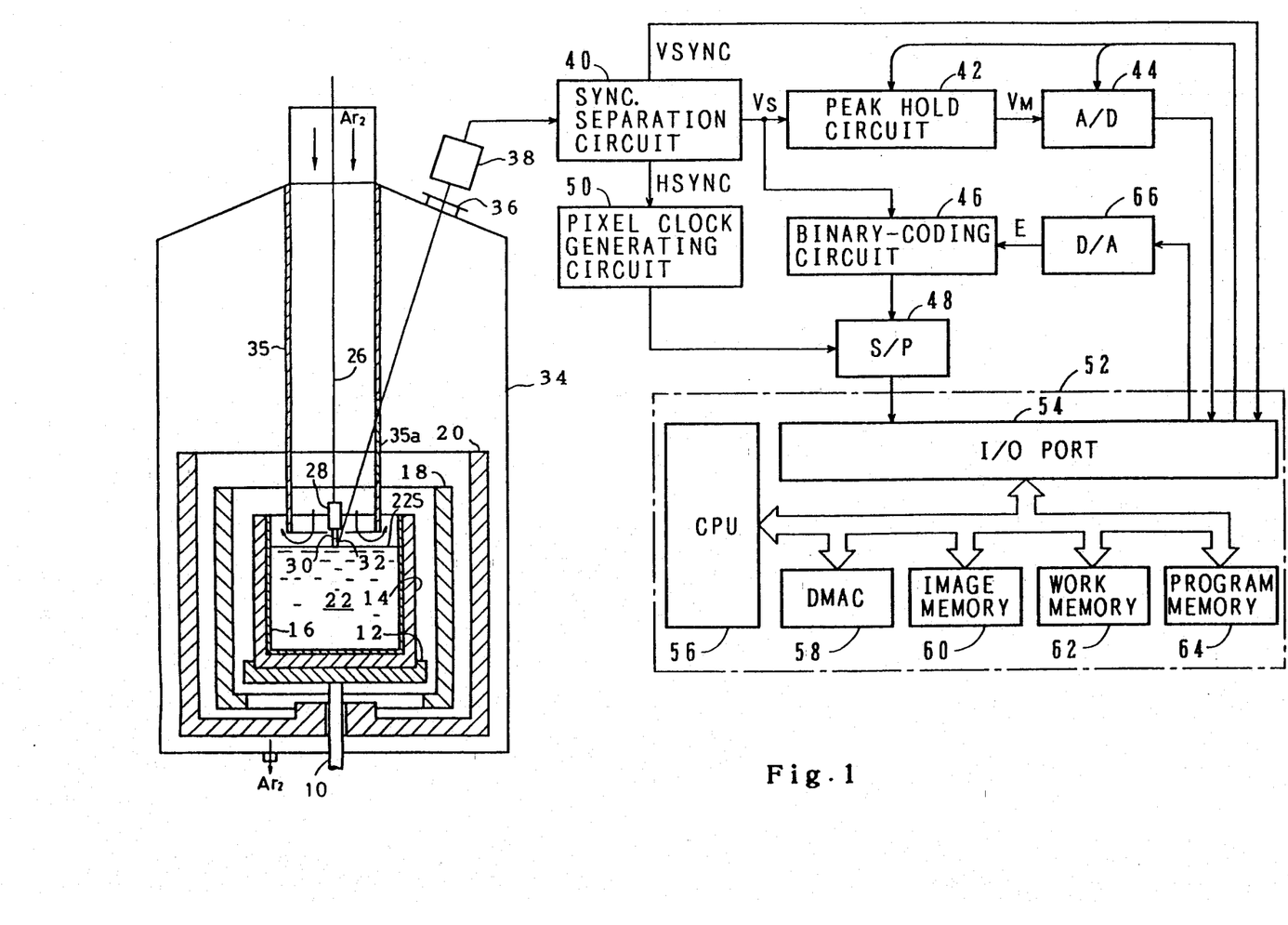
FIG. 1 is a block diagram showing the construction of the hardware of an apparatus for measuring both crystal diameter and oscillation of melt surface.

As shown in FIG. 1, a typical conventional apparatus for growing a single crystal has a a chamber 34 in which is disposed a gas-flow guiding sleeve 35 of a cylindrical cross-section arranged coaxially with the axis 10. In operation, argon gas flows through the gas-flow guiding sleeve 35 from the upper end to the lower end of the same. Since the argon gas is heated by the heat radiated from a melt 22, the flow of the argon gas tends to be disturbed. The flow of the argon gas is made to go outward through the gap between the lower end of the gas flow guiding sleeve 35 and the surface 22S of the melt. Part of the flow of the argon gas, however, collides with the surface of melt surface 22S to cause an oscillation of the melt surface 22S.

The oscillation of the melt surface 22S makes it difficult to continue the growth of the crystal particularly during the growth of the neck portion in which the crystal diameter is small, because the lower end of the grown crystal 32 tends to be disconnected from the melt surface 22S to disable further growth of the crystal.

SUMMARY OF THE INVENTION

Accordingly, an object of the present invention is to provide a method of and an apparatus for measuring oscillation of a melt surface which are suitable for use in growing a single crystal by Czochralski method, particularly in growing a neck portion of the single crystal.

To this end, according to one aspect of the present invention, there is provided a method of measuring oscillation of a melt surface in a process for growing a single crystal by Czochralski method, taking the image of the portion of the single crystal which is being grown by Czochralski method, detecting, on the basis of the video signal output from the camera, the outside diameter $D_o$ of a bright ring image at which the brightness becomes greater than a predetermined reference value, and detecting the amount of oscillation as the amount of oscillation of the melt surface in the region near the single crystal portion which is being grown.

When argon gas is supplied as shown in FIG. 1, the outside diameter $D_o$ of the bright ring oscillates in a manner shown in FIGS. 6A to 6D, even when pulling of the crystal is being suspended. It is therefore possible to detect the amount of oscillation of the outside diameter $D_o$ of the bright ring as the amount of oscillation of the melt surface in the region near the region where the single crystal is being grown.

As explained before, growth of the single crystal tends to be failed during forming of the neck portion which has a specifically small diameter, particularly when the amount of oscillation of the melt surface is large, because the neck portion of the crystal which is being grown is liable to be disconnected from the melt surface due to oscillation of the melt surface. Therefore, the rate of success of growing the neck portion will be increased when the growth is controlled in accordance with the result of the measurement of oscillation of the melt surface.

The measurement of oscillation of the melt surface in the region near the crystal also offers an advantage in that the control of the operation for growing the crystal is facilitated.

The present invention also provides an apparatus suitable for use in carrying out the method of the present invention.

Thus, according to another aspect of the present invention, there is provided an apparatus for measuring the oscillation of a melt surface in growing a single crystal by Czochralski method, comprising: a camera for taking the image of the position of the crystal which is being grown and producing a video signal corresponding to the taken image; means for detecting the maximum value of the video signal over a time period which is not smaller than one scanning line; means for determining a reference value corresponding to the maximum value; means for binary-coding the video signal in accordance with the reference value; means for measuring the outside diameter of a bright ring image; and means for detecting the amount of oscillation of the detected diameter of the bright ring as the amount of oscillation of the melt surface in the region near the region where the single crystal is grown.

This apparatus for measuring oscillation of the melt surface can be economically constructed as a unit with a crystal diameter measuring apparatus.

The above and other objects, features and advantages of the present invention will become clear from the following description of the preferred embodiments when the same is read in conjunction with the accompanying drawings.

BRIEF DESCRIPTION OF THE DRAWINGS

The accompanying drawings FIGS. 1 to 9 show an embodiment of the present invention in which:

DESCRIPTION OF THE PREFERRED EMBODIMENT

A preferred embodiment of the present invention will be described with reference to the accompanying drawings. Description of Diameter/Level Measuring Apparatus FIG. 1 shows the critical portion of an apparatus for measuring the crystal diameter and oscillation of the melt surface embodying the present invention.

A table 12 fixed to the upper end of a shaft 10 carries a graphite crucible 14 in which is fitted a quartz crucible 16. The graphite crucible 14 is surrounded by a heater 18 which in turn is surrounded by a graphite heat insulator 20. In operation of the apparatus, a mass of polycrystalline silicon is charged in the quartz crucible 16 and electrical power is supplied to the heater 18, so that the polycrystalline silicon is molten to become a melt 22.

On the other hand, a seed crystal 30 is secured through a seed holder 28 to the lower end of the wire 26 which is disposed above the melt 22 and which is adapted to be pulled and lowered by a motor which is not shown. The wire is lowered to bring the lower end of the seed crystal 30 into contact with the melt surface 22S and is then pulled to raise the seed crystal 30, so that a single crystal 32 of silicon is grown on the lower end of the seed crystal 30. The growth of the single crystal 32 is effected in a chamber 34 in which argon gas is circulated under a reduced pressure. A gas flow guiding sleeve 35 having a circular cross-section is disposed in the chamber 34 coaxially with the shaft 10. Argon gas flows through the gas flow guiding sleeve 35 from the upper side to the lower side thereof and then flows upward through the clearance between the lower end of the gas flow guiding sleeve 35 and the melt surface 22S and then introduced to the lower portion of the region in the chamber 34 so as to be discharged to the exterior of the chamber 34 by suction. A sight window 35a is provided in the wall of the gas flow guiding sleeve 35.

In order to measure the real diameter $D_R$ of the lower end of the silicon single crystal 32, a CCD camera 38 is disposed above a window 36 provided in a shoulder portion of the wall of the chamber 34 and is aimed at the center of the melt surface 22S. In view of the fact that the restricted neck portion of the silicon single crystal 32 is small, the CCD camera is arranged to provide a large magnification of the image such that the length of one scanning line corresponds to, for example, 0.05 mm of the diameter of the real neck portion of the silicon single crystal 32.

A composite video signal from the CCD camera 38 is delivered to a synchronizing signal separation circuit 40 which separates the video signal from synchronizing signals. The image signal thus separated is supplied to a peak hold circuit 42 which operates to hold the maximum voltage $V_M$ of the video signals Vs which have been supplied after a reset of this circuit. The maximum voltage $V_M$ is then supplied to an A/D converter 44 so as to be digitized.

Meanwhile, the video signal Vs from the synchronizing signal separation circuit 40 is supplied also to a binary-coding circuit 46 and is compared with a reference voltage E so as to be binarized. The binary signal thus obtained is supplied to an S/P converter 48. The horizontal synchronizing signal HSYNC is supplied to a pixel clock generating circuit 50 which forms, in synchronization with the horizontal synchronizing signal HSYNC, pixel clocks which divide the video signal into a plurality of pixels. The pixel clocks are supplied to the control terminal 48 of an S/P converter 48. The S/P converter 48 reads one-bit pixel data from the binary-coding circuit 46 in response to each pixel clock and delivers the successive pixel data to an internal shift register (not shown) so as to form a bit-parallel data. The shift register delivers one-word data to an I/0 port 54 of a microcomputer 52 each time such one-word data is formed in the shift register.

The microcomputer 52, as known per se, has a CPU 56, a DMA controller 58, an image memory 60, a work memory 63 and a program memory 64, in addition to the I/P port 54 mentioned above. The I/0 port 54 receives a vertical synchronizing signal VSYNC which is supplied as an interruption signal from the synchronizing signal separation circuit 40. The maximum voltage VM also is supplied to the I/O port 54 from the A/D converter. The aforementioned reference voltage E, which is used for binarization, is supplied from the I/0 port 54 to the binary-coding circuit 46 via a D/A converter 66. Description of Software of Microcomputer 52

The software on the microcomputer 52 incorporated in the hardware shown in FIG. 1 will be described with reference to FIGS. 2 to 5.

Figure 2:
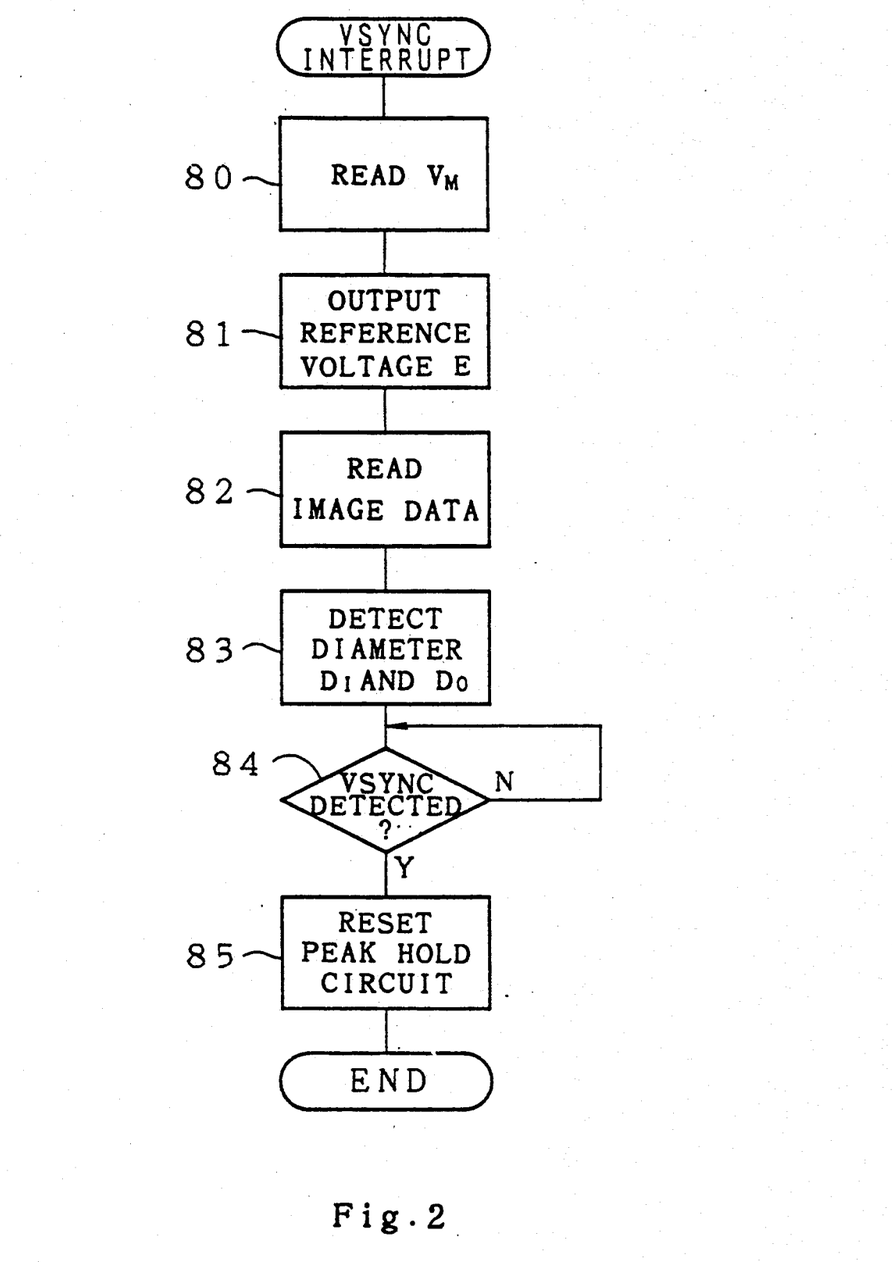
FIG. 2 is a flow chart showing the software used in a microcomputer 5 which is incorporated in the hardware shown in FIG. 1.

The flow chart shown in FIG. 2 is initiated each time the vertical synchronizing signal VSYNC as an interruption signal is supplied to the CPU 56 from the synchronizing signal separation circuit 40 via the I/0 port 54.

In Step 80, the maximum voltage $V_M$ is read from the A/D converter 44 while the interruption is masked. The maximum voltage $V_M$ is the greatest One of peak values of the signals obtained on each horizontal scanning line within one field between a moment of supply of a vertical synchronizing signal VSYNC which is immediately before an interruption and the moment of supply of a vertical synchronizing signal of the next interruption. The maximum voltage $V_M$ thus corresponds to the maximum level of brightness.

In Step 81, the maximum voltage $V_M$ is multiplied with a predetermined constant value K and the product is supplied as a reference voltage E to the D/A converter 66. The preferred value of K will be described later.

In Step 82, the video signal Vs of one field is compared with the reference voltage E by the binary-coding circuit 46 so as to be binarized. The serial data formed by the binary signals thus obtained are supplied to the S/P converter 48 so as to be changed into parallel data which is then stored in an image memory 60 by the operation of the DMA controller 58.

Figure 3:
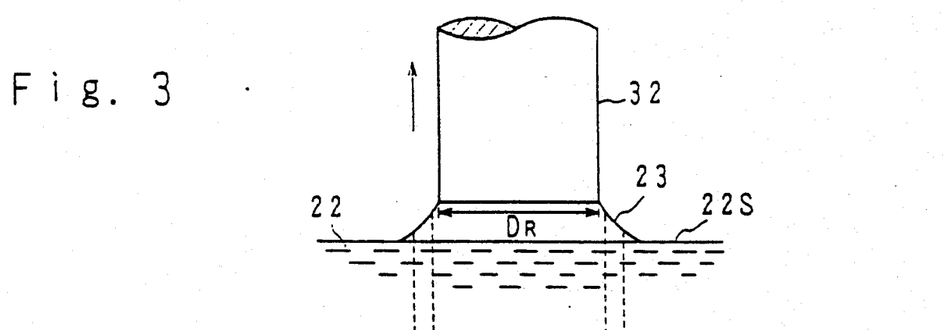
FIG. 3 is an illustration of a state of the boundary between a melt surface and a single crystal.
Figure 4:
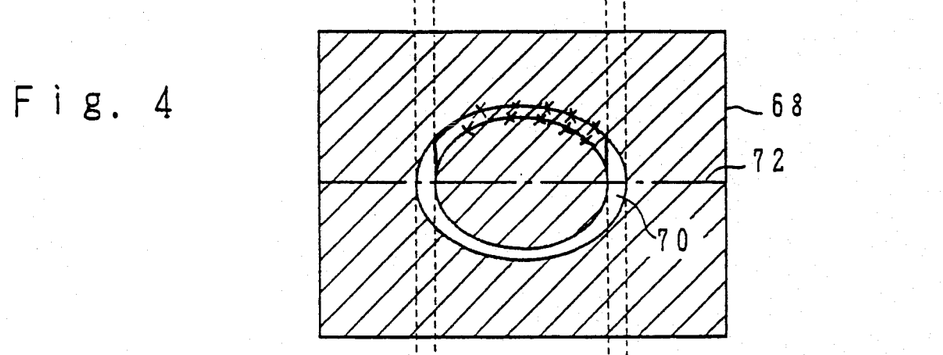
FIG. 4 is an illustration of a binary image corresponding to the state shown in FIG. 3 and stored in an image memory in the hardware of FIG. 1.
Figure 5:
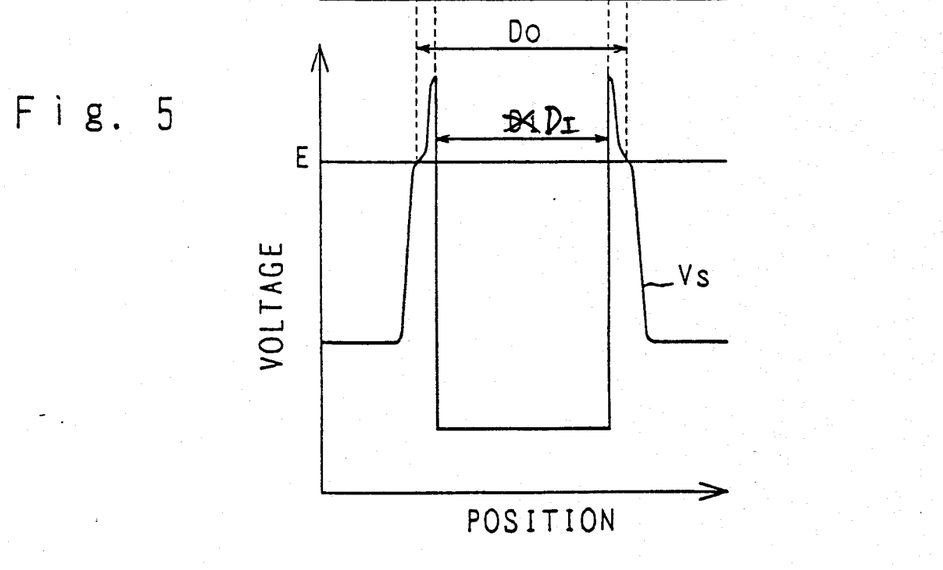
FIG. 5 is an illustration of the relationship between a reference voltage E and a video signal Vs along a horizontal scanning line corresponding to a longer diametrical line of the binary image shown in FIG. 4.
Figure 6A:
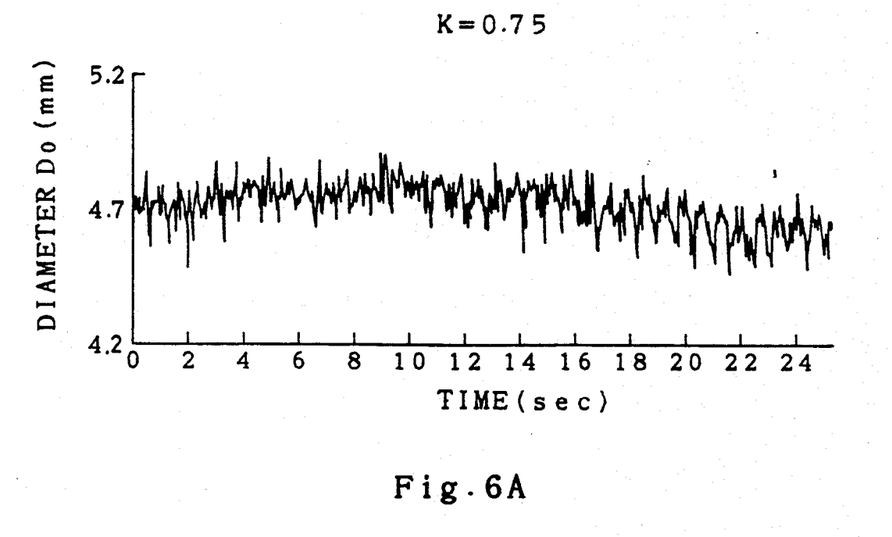
FIGS. 6A to 6D are graphs showing the manner in which the outside diameter $D_o$ is changed in relation to time when the velocity of pulling of the crystal is reduced to 0 (zero)
Figure 6B:
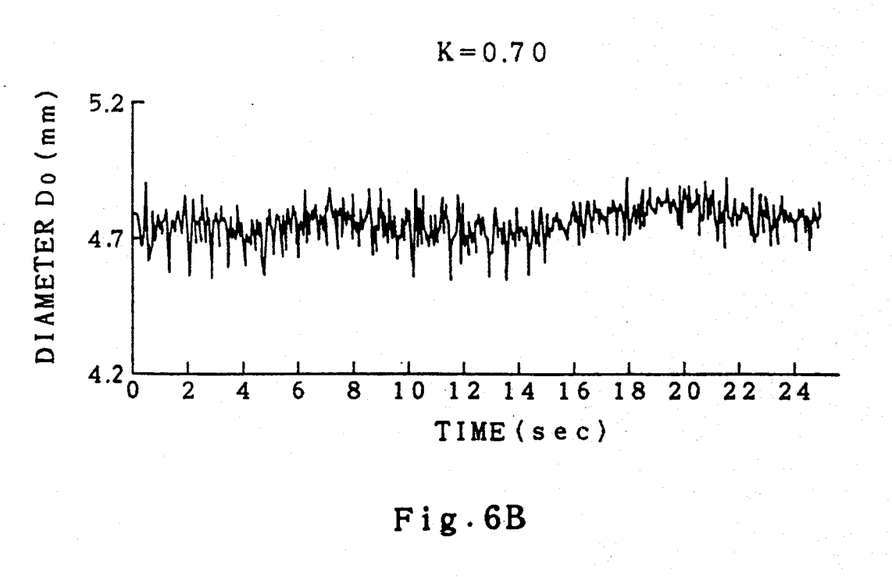
Figure 6C:
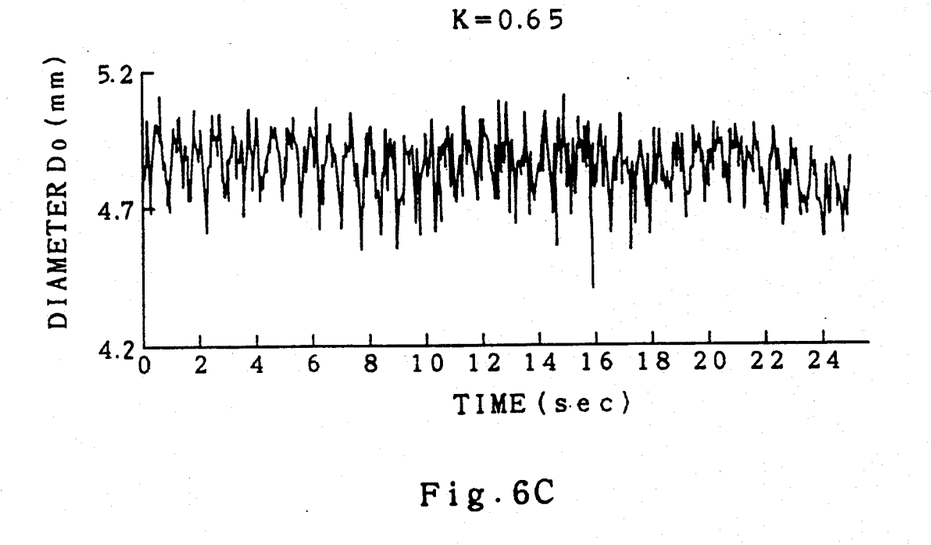
Figure 6D:
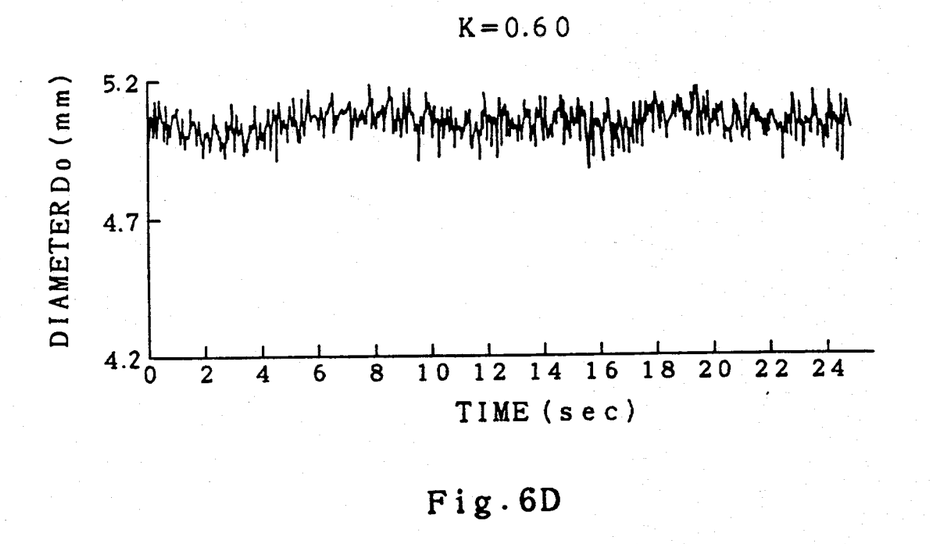

FIG. 4 shows the binary image 68 stored in the image memory 60, in relation to the state between the crystal 32 and the melt surface 22S shown in FIG. 3. The binary image 68 includes a bright ring image 70 corresponding to a bright ring 23 which is formed in the above-mentioned boundary between the silicon single crystal 32 and the melt surface 22S.

In Step 83, the binary image 68 in the image memory 60 is horizontally scanned so that the bright ring image 70 is detected. The detection is conducted by determining the numbers $N_1, N_2, N_3$ and $N_4$ of pixels at positions where the level of the video signal is changed between 0 and 1, as counted from the left end of each horizontal scanning line. Thus, these pixel numbers meet the condition of $N_1 < N_2 < N_3 < N_4$. Then, $X_O = N_4 = N_1$ and $X_I = N_3 = N_2$ are computed to determine $D_O = X_o$ and $D_I = X_I$ which are then temporarily stored.

Determination of $X_O$ and $X_I$ also is conducted for the next horizontal line of scan. If the condition of $X_O > D_o$, the value of $D_o$ is updated in conformity with the new value $X_o$. Similarly, when condition of $X_I > D_I$ is met, the value $D_I$ is updated with the new value of $X_I$.

This operation is repeated until the bright ring image 70 becomes no more detectable. As a consequence, the updated values of $D_o$ and $D_I$ respectively represent the outside diameter and the inside diameter of the bright ring image 70. FIG. 6 shows the relationship between the video signal V and the reference voltage E.

In Step 84, the process waits for the detection of the next vertical synchronizing signal VSYNC.

In Step 85, the peak hold circuit 42 is reset by a discharge from a capacitor therein, upon detection of the next vertical synchronizing signal VSYNC, thus dismissing the interruption mask. It is thus possible to measure the outside diameter $D_o$ and the inside diameter $D_I$ of the bright ring image.

The inside diameter $D_I$ is substantially proportional to the real diameter $D_R$. The amount of oscillation of the melt surface is determined from the outside diameter $D_o$ by a process which is different from that shown in FIG. 2 or by a hardware.

DESCRIPTION OF RELATION BETWEEN OUTSIDE DIAMETER $D_o$ AND OSCILLATION OF MELT SURFACE

A description will now be given of the relationship between the outside diameter $D_o$ and the oscillation of the melt surface.

As in ordinary process for growing a single crystal, a wire 26 suspending a seed crystal with a circular cross-section of 10 mm indiameter is lowered to dip the lower end of the crystal in th melt 22, while the argon gas is being made to flow downward in the gas flow guiding sleeve 35. The wire 26 is then pulled to grow the crystal while decreasing the diameter of the crystal or 4 to 5 mm. In order to examine the relationship between the outside diameter $D_o$ and the oscillation of the melt surface, the outside diameter $D_o$ of the crystal was measured with the velocity of pulling of the wire set to zero, by while setting the coefficient K in Step 81 to 0.75, 0.70, 0.65 and 0.60, the results being shown in FIGS. 6A to 6D.

From the graphs shown in FIGS. 6A to 6D, it will be understood that there is an optimum value of the coefficient K for maximizing the sensitivity of oscillation of the melt surface. More specifically, it is understood that this optimum value is around 0.65. This optimum value, however, depends on the aperture value of the lens of the CCD camera 38. Namely, when the aperture size is increased while maintaining a constant value of the coefficient K, the bright ring image 70 is progressively thinned so as to be cut at a portion of the ring thus forming a C-like form, making it impossible to detect the oscillation of the melt surface.

The amount $S_v$ of the melt surface level, i.e., the amount of oscillation of the outside diameter Do, can be detected by extracting the oscillating component of the outside diameter $D_o$ with or without a further processing of the detected oscillation component, by one of the following methods.

(1) To determine the amount $S_v$ of oscillation of the melt surface as the difference between the value of the outside diameter $D_o$ and the value obtained by passing the value $D_o$ through a digital or analog low-pass filter.

(2) To determine the amount $S_v$ of oscillation of the melt surface as the difference between the value of the outside diameter $D_o$ and a mean value of the measured values of the outside diameter $D_o$ over a predetermined period, e.g., one second.

(3) To determine the amount $S_v$ of oscillation of the melt surface as the peak value or amplitude of the difference determined by the method (1) or (2) mentioned above.

(4) To determine the amount $S_v$ of oscillation of the melt surface by integrating the absolute values of differences determined by the method (1) or (2) above for a predetermined period, e.g., one second.

APPLICATION OF RESULT OF MEASUREMENT OF MELT SURFACE OSCILLATION TO CONTROL OF GROWTH OF CRYSTAL NECK PORTION

A description will now be given of an example of application of the result of measurement of the melt surface oscillation to the control for growing the neck portion of the crystal.

When the crystal under the growth is narrowed to a small diameter of 5 mm or less, the crystal tends to be disconnected at its lower end from the melt surface 22S, or growth of the crystal is interrupted due to disorder of the crystal. The disconnection or interruption tends to occur when the crystal diameter is being decreased. The disconnection or interruption, however, can be avoided by reducing the velocity of pulling of the wire 26 to zero. It is, however, not preferred to repeatedly stop the pulling of the wire 26.

Figure 7:
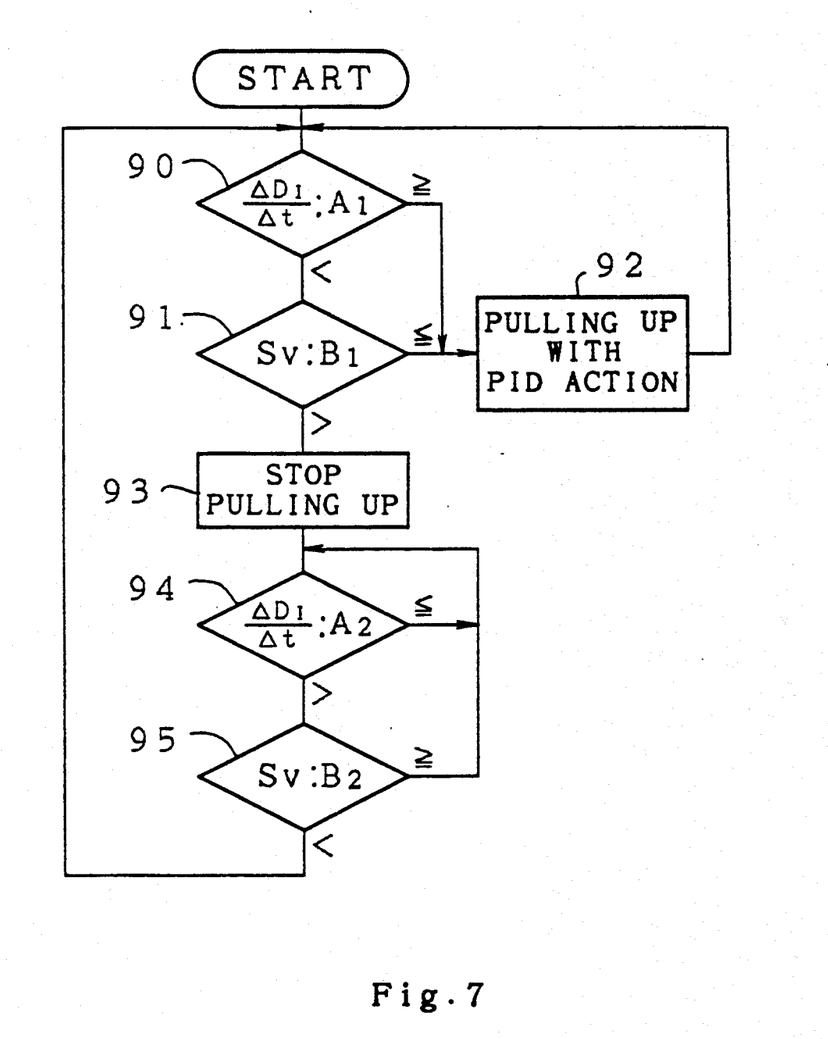
FIG. 7 is a flow chart showing a process of controlling crystal pulling velocity conducted on the basis of measurement of oscillation of melt surface.

In a specific form of the present invention, therefore, the velocity of pulling the single crystal is controlled in a manner shown in FIG. 7.

In Step 91, a variance $\Delta D_I/\Delta t$ of the inside diameter $D_I$ per unit time t is compared with a predetermined negative value $A_I$. If the variance $\Delta D_I/\Delta t$ is not smaller than $A_I$, the process proceeds to Step 92 in which the pulling velocity V is controlled by a PID action to as to maintain the crystal diameter $D_I$ at a command value.

When the variance $\Delta D_I/\Delta t$ is smaller than $A_I$, the process proceeds to Step 91 in which the amount $S_v$ of oscillation of the melt surface is compared with a constant value $BE_I$. If the oscillation amount $S_v$ is equal to or below the value $BE_I$, Step, 92 is executed in which, as explained above, the pulling velocity V is controlled by a PID action to as to maintain the crystal diameter $D_I$ at a command value.

If conditions $\Delta D_I/\Delta t$ being smaller than $A_I$ and $S_v$ being greater than BEI are sequentially confirmed through Steps 90 and 91, the process proceeds to Step 93 in which the PID control is dismissed and the wire pulling velocity V is set to 0 (zero).

The process then proceeds to Step 94 which determines whether the variance $\Delta D_I/\Delta t$ is not greater than a positive constant value A. If the answer is YES, i.e., if the variance $\Delta D_I/\Delta t$ is not greater than the positive constant value A, the pulling of the wire is kept stopped. If the variance $\Delta D_I/\Delta t$ is determined to be greater than the value $A_2$, the process proceeds to Step 95 which determines whether the amount $S_v$ of oscillation of the melt surface is not smaller than a predetermined value $BE_2$. If the answer is YES, i.e., when the amount $S_v$ of oscillation of the melt surface is determined to be not smaller than $BE_2$, the pulling of the wire 26 is kept stopped.

When the conditions of $\Delta D_I/\Delta t$ being greater than $A_2$ ($A_2 \geq A_1$, $A_2$ being preferably positive) and $S_v < BE_2$ ($BE_2 \geq BE_1$) are met, the process returns to Step 92 to commence the PID action for controlling the velocity of pull of the wire.

Figure 8:
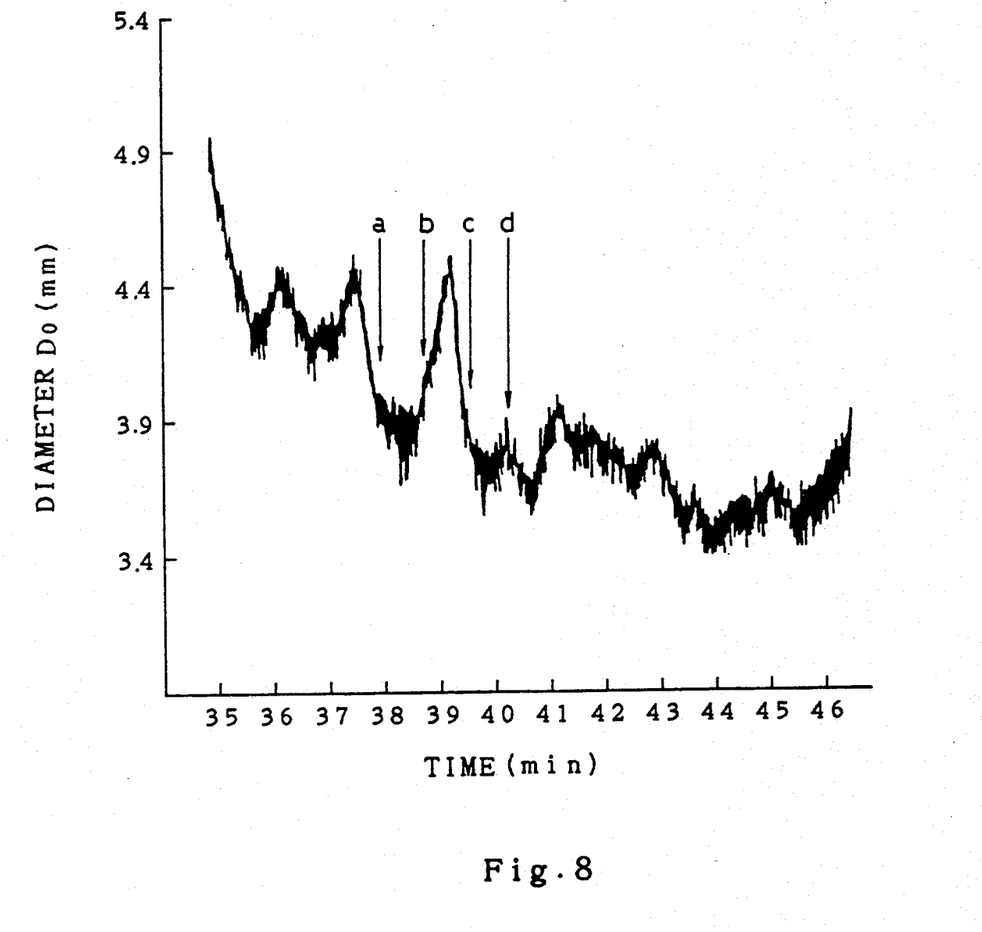
FIG. 8 is a graph showing the manner in which the outside diameter DO is changed in relation to time t after commencement of pulling of a seed crystal.
Figure 9:
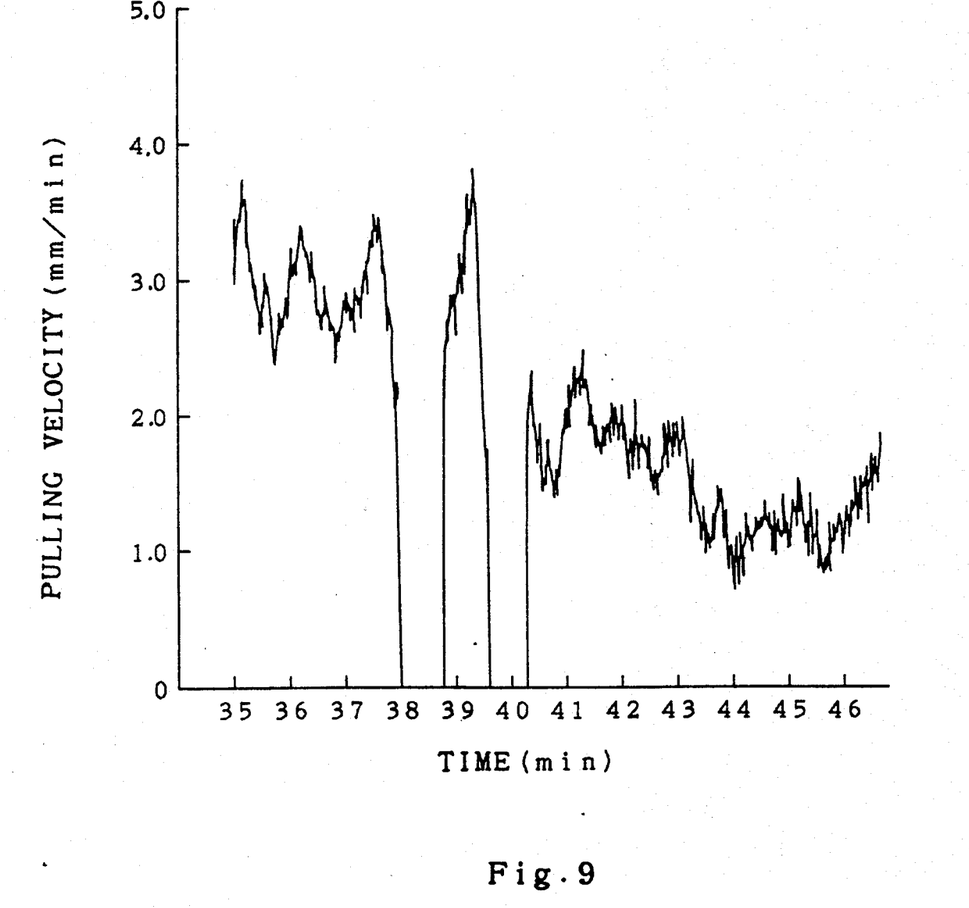
FIG. 9 is a graph showing the manner in which a crystal pulling velocity V is changed in relation to time t after commencement of pulling of the seed crystal.

FIGS. 8 and 9 are graphs showing results of an experimental control executed in accordance with the process described above. More specifically, FIG. 8 shows the change in the velocity of pulling the wire in relation to time, while FIG. 9 shows the change in the outside diameter $D_o$ in relation to time t. The time t was measured from a moment at which the pulling of the seed crystal 30 was commenced. Referring to FIG. 8, pulling of the seed crystal 30 was suspended in the period between moments a and b and between moments c and d. Thus, pulling of the wire was suspended twice in the period of 47 minutes after the start of pulling of the wire, and the total period of suspension was about 2 minutes. No substantial problem was caused by the suspension of pulling.

The amplitude of oscillating component of the melt surface was used as th amount $S_v$ of oscillation of the melt surface. The values of the above-mentioned thresholds $A_1, A_2$, $BE_1$ and $BE_2$ were respectively set as follows:

$A_1 = 0.03$ mm/sec $A_2 = 0.03$ mm/sec $BE_1 = BE_2 = 0.2$ mm

A higher rate of success of growing the neck portion of the single crystal could be attained by the control described hereinbefore.

In addition, the melt surface oscillation measuring apparatus could be economically constructed as a unit with the apparatus for measuring the diameter of the single crystal.

Furthermore, the measurement of the melt surface in the region where the crystal is grown contributed to the ease of control of growth of crystal.

What is claimed is:

1. A method of measuring oscillation of a melt surface in growing a single crystal by Czochralski process, comprising the steps of:

taking, by a camera (38), the image of a region where said single crystal is being grown by the Czochralski process;

detecting the outside diameter ($D_o$) of a bright ring image (70) at which the brightness is not lower than a predetermined reference value (E), in accordance with video signals output from a camera; and detecting the amount ($S_v$) of oscillation of said outside diameter as the amount of oscillation of the melt surface near the region where said single crystal is grown.

2. A method according to claim 1, wherein said reference value (E) is determined by multiplying the maximum brightness value of the video signals in one field with a predetermined constant (K).

3. A method according to claim 2, wherein said constant (K) is a value which, when a pulling up velocity of said single crystal is fixed to zero, substantially maximizes the amount of oscillation of said outside diameter ($D_o$).

4. A method according to claim 3, wherein said amount ($S_v$) of oscillation of the melt surface is the difference between said outside diameter ($D_o$) and a value obtained by passing said outside diameter through a low-pass filter.

5. A method according to claim 3, wherein said amount ($S_v$) of oscillation of melt surface is the amplitude of the difference between said outside diameter ($D_o$) and a value obtained by passing said outside diameter through a low-pass filter.

6. A method according to claim 3, wherein said amount ($S_v$) of oscillation of melt surface is a value determined by integrating, over a predetermined past time, the absolute values of the differences between the values of said outside diameter ($D_o$) and values obtained by passing said values of outside diameter through a low-pass filter.

7. A method according to claim 3, wherein said amount ($S_v$) of oscillation of the melt surface is the difference between said outside diameter ($D_o$) and the mean value of the values of said outside diameter over a predetermined past time.

8. A method according to claim 3, wherein said amount ($S_v$) of oscillation of the melt surface is the amplitude of the difference between said outside diameter ($D_o$) and the mean value of the values of said outside diameter over a predetermined past time.

9. A method according to claim 3, wherein said amount ($S_v$) of oscillation of the melt surface is a value determined by integrating, for a predetermined past time, the absolute values of the differences between said outside diameter and the mean value of the values of said outside diameter over a predetermined past time.

10. An apparatus for measuring oscillation of a melt surface in growing a single crystal by Czochralski process, comprising:
- a camera (38) for taking the image of a region where said single crystal is being grown by the Czochralski process and for producing video signals corresponding to the image
- means (42, 44) for detecting the maximum brightness value ($V_M$) of the video signal over a period not shorter than the period of one scanning line;
- means (52, 81) for determining a reference value (E) corresponding to said maximum value;
- means (46-50, 66) for binary-coding said image signal on the basis of said reference signal;
- means (52, 82, 83) for detecting a outside diameter ($D_o$) of a bright ring image (70) on the basis of a binary image formed by the binary coding; and
- means for detecting the amount of oscillation of said outside diameter as the amount of oscillation of the melt surface in the region near the region where said single crystal is grown.

11. An apparatus according to claim 10, wherein said reference value (E) is determined by multiplying the maximum value of the video signals in one field with a predetermined constant (K).

12. An apparatus according to claim 11, wherein said constant (K) is a value which, when a pulling up velocity of said single crystal is fixed to zero, substantially maximizes the amount of oscillation of said outside diameter ($D_o$).

13. An apparatus according to claim 12, wherein said amount ($S_v$) of oscillation of the melt surface is the difference between said outside diameter ($D_o$) and a value obtained by passing said outside diameter through a low-pass filter.

14. An apparatus according to claim 12, wherein said amount ($S_v$) of oscillation of melt surface is the amplitude of the difference between said outside diameter ($D_o$) and a value obtained by passing said outside diameter through a low-pass filter.

15. An apparatus according to claim 12, wherein said amount ($S_v$) of oscillation of melt surface is a value determined by integrating, over a predetermined past time, the absolute values of the differences between the values of said outside diameter ($D_o$) and values obtained by passing said values of outside diameter through a low-pass filter.

16. An apparatus according to claim 12, wherein said amount ($S_v$) of oscillation of the melt surface is the difference between said outside diameter ($D_o$) and the mean value of the values of said outside diameter over a predetermined past time.

17. An apparatus according to claim 12, wherein said amount ($S_v$) of oscillation of the melt surface is the amplitude of the difference between said outside diameter ($D_o$) and the mean value of the values of said outside diameter over a predetermined past time.

18. An apparatus according to claim 12 wherein said amount ($S_v$) of oscillation of the melt surface is a value determined by integrating, for a predetermined past time, the absolute values of the differences between said outside diameter ($D_o$) and the mean value of the values of said outside diameter over a predetermined past time.

* * * * *